(12) United States Patent
Shirazi Hosseini Dokht et al.

(10) Patent No.: US 11,936,158 B2
(45) Date of Patent: Mar. 19, 2024

(54) VARIABLE TRACE WIDTH FOR INDIVIDUAL VERTICAL CAVITY SURFACE EMITTING LASER CHANNELS FOR TIME OF FLIGHT ILLUMINATORS

(71) Applicant: Lumentum Operations LLC, San Jose, CA (US)

(72) Inventors: Mohammad Ali Shirazi Hosseini Dokht, Milpitas, CA (US); Ajit Vijay Barve, San Jose, CA (US); Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 700 days.

(21) Appl. No.: 16/949,213

(22) Filed: Oct. 20, 2020

(65) Prior Publication Data
US 2022/0052509 A1     Feb. 17, 2022

Related U.S. Application Data

(60) Provisional application No. 62/706,385, filed on Aug. 13, 2020.

(51) Int. Cl.
    *H01S 5/042*      (2006.01)
    *H01S 5/183*      (2006.01)
    *H01S 5/42*      (2006.01)

(52) U.S. Cl.
CPC .......... *H01S 5/04256* (2019.08); *H01S 5/423* (2013.01); *H01S 5/18394* (2013.01)

(58) Field of Classification Search
CPC .............................. H01S 5/423; H01S 5/04256
See application file for complete search history.

(56) References Cited

U.S. PATENT DOCUMENTS

| | | | |
|---|---|---|---|
| 2002/0028390 A1* | 3/2002 | Mazed | G02B 6/4277 430/296 |
| 2003/0026303 A1* | 2/2003 | Ouchi | H01S 5/423 372/50.1 |
| 2009/0129417 A1* | 5/2009 | Maeda | H01S 5/18355 438/46 |
| 2016/0197452 A1* | 7/2016 | Mor | H01S 5/423 359/569 |
| 2019/0199063 A1 | 6/2019 | Barve et al. | |
| 2020/0083669 A1* | 3/2020 | Na | G01P 13/00 |
| 2021/0104867 A1* | 4/2021 | Weigl | H01S 5/18344 |
| 2021/0320478 A1* | 10/2021 | Van Leeuwen | H01S 5/04256 |
| 2021/0344174 A1* | 11/2021 | Barve | H01S 5/1071 |
| 2022/0260684 A1* | 8/2022 | Kobayashi | G01S 7/4815 |

* cited by examiner

*Primary Examiner* — Sean P Hagan
(74) *Attorney, Agent, or Firm* — Harrity & Harrity, LLP (57) ABSTRACT

In some implementations, a vertical-cavity surface-emitting laser (VCSEL) array may comprise a plurality of channels, a plurality of traces, and a plurality of emitters. A channel, of the plurality of channels, may include a set of emitters, of the plurality of emitters, arranged in a row of emitters. The channel may include a trace, of the plurality of traces, that has a trace width that is tapered along a length of the trace. Numerous other aspects are provided.

20 Claims, 6 Drawing Sheets

VARIABLE TRACE WIDTH FOR INDIVIDUAL VERTICAL CAVITY SURFACE EMITTING LASER CHANNELS FOR TIME OF FLIGHT ILLUMINATORS

RELATED APPLICATION

This application claims priority to U.S. Provisional Patent Application No. 62/706,385, for "OPTIMIZED TRACE DESIGN FOR INDIVIDUAL VERTICAL CAVITY SURFACE EMITTING LASER CHANNELS FOR TIME OF FLIGHT ILLUMINATORS," filed on Aug. 13, 2020, the content of which is incorporated by reference herein in its entirety.

TECHNICAL FIELD

The present disclosure relates generally to a vertical-cavity-surface-emitting laser (VCSEL) array and to a variable trace width for at least one channel of the VCSEL array.

BACKGROUND

An emitter may include a VCSEL, such as a top-emitting VCSEL, a bottom-emitting VCSEL, a common anode VCSEL, a common cathode VCSEL, and/or the like, as well as a laser, and/or the like. A VCSEL is a laser in which a beam is emitted in a direction perpendicular to a surface of the VCSEL (e.g., vertically from a surface of the VCSEL). Multiple emitters may be arranged in an emitter array with a common substrate.

SUMMARY

In some implementations, a VCSEL array includes a plurality of channels; a plurality of traces; and a plurality of emitters, wherein: a channel, of the plurality of channels, includes a set of emitters, of the plurality of emitters, arranged in a row of emitters, the channel includes a trace, of the plurality of traces, that has a trace width that is tapered along a length of the trace.

In some implementations, a VCSEL array includes a plurality of channels; a plurality of traces; a plurality of emitters; and a plurality of bondpads, wherein: a channel, of the plurality of channels, includes a set of emitters, of the plurality of emitters, arranged in a row of emitters, and the channel includes a trace, of the plurality of traces, that is configured to transmit an input electric current to the set of emitters provided by a bondpad, of the plurality of bondpads, that is associated with the channel, wherein the trace comprises a particular trace portion that is associated with a subset of emitters, of the set of emitters, and that is associated with a variable trace width.

In some implementations, a VCSEL array includes a plurality of channels; a plurality of traces; a plurality of emitters; and a plurality of bondpads, wherein: a channel, of the plurality of channels, includes a set of emitters, of the plurality of emitters, arranged in a row of emitters; and the channel includes a trace, of the plurality of traces, that is configured to transmit an input electric current to the set of emitters provided by a bondpad, of the plurality of bondpads, associated with the channel, wherein the trace comprises a first trace portion that is closest to the bondpad and a second trace portion that is farthest from the bondpad, wherein the first trace portion is associated with a first subset of emitters, of the set of emitters, and is associated with a uniform first trace width, and wherein the second trace portion is associated with a second subset of emitters, of the set of emitters, and is associated with a variable second trace width.

DETAILED DESCRIPTION

The following detailed description of example implementations refers to the accompanying drawings. The same reference numbers in different drawings may identify the same or similar elements.

Time-of-flight (TOF) systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses. A TOF system may include an emitter array (e.g., a VCSEL array) with multiple rows of emitters, where each row of emitters corresponds to a channel, and multiple emitters are in each row. Emitter separation within a channel (e.g., within a row corresponding to the channel) may determine an angular resolution of the TOF system in a horizontal direction and spacing between different channels may relate to a vertical resolution of the TOF system.

Each channel of the emitter array that includes a row of emitters may have a trace (e.g., a metallization layer) provided on top of the emitter array to provide an electrical connection between the emitters and a bondpad for connecting to a drive circuit. Typically, the trace has a uniform trace width along the length of the trace within the channel (e.g., the trace has the same trace width at any position on the trace). However, a parasitic impedance associated with the uniform trace width causes an amount of current that reaches emitters that are farthest away from the bondpad to be less than an amount of current that reaches emitters that are closest to the bondpad. Accordingly, in many cases, the row of emitters is not able to provide a uniform amount of optical power, which impacts a performance of the TOF system.

Some implementations described herein provide an emitter array (e.g., a VCSEL array) that comprises a plurality of channels, a plurality of traces, and a plurality of emitters. A channel, of the plurality of channels, may include a set of emitters, of the plurality of emitters, arranged in a row of emitters. The channel may include a trace, of the plurality of traces, that has a variable trace width along a length of the trace. For example, the trace width may be tapered along a length of the trace such that the trace has a maximum width at a position closest to a bondpad associated with the channel, a progressively narrower width at one or more representative positions on the trace farther from the bondpad, and a minimum width at a position farthest from the bondpad. As another example, the trace width of a portion of the trace may vary between local maximum widths and minimum widths at different positions along the portion of the trace. The channel may be associated with a particular trace configuration direction and/or taper direction and an adjacent channel, of the plurality of channels, may be similarly configured as the channel, but may be associated with a different trace configuration direction and/or taper direction (e.g., an opposite trace configuration direction and/or an opposite taper direction).

In this way, a variable trace width of a trace, as described herein, that is associated with a row of emitters of a channel of an emitter array reduces trace-impedance along the trace and therefore reduces a voltage drop along the trace, which minimizes a parasitic power drop along the trace. Accordingly, this facilitates a uniform emission of optical power along the row of emitters of the channel, minimizes a rise and fall time of an optical pulse associated the row of emitters, and reduces a voltage overshoot associated with the row of emitters. Moreover, respective locations of the row of emitters within the channel are maintained as compared to a row of emitters of a channel of a conventional emitter array, so the emitter array described herein can be used in a TOF system that uses a conventional emitter array. Accordingly, a performance of the TOF system is improved when using the emitter array described herein as compared to using a conventional emitter array.

Figure 1:
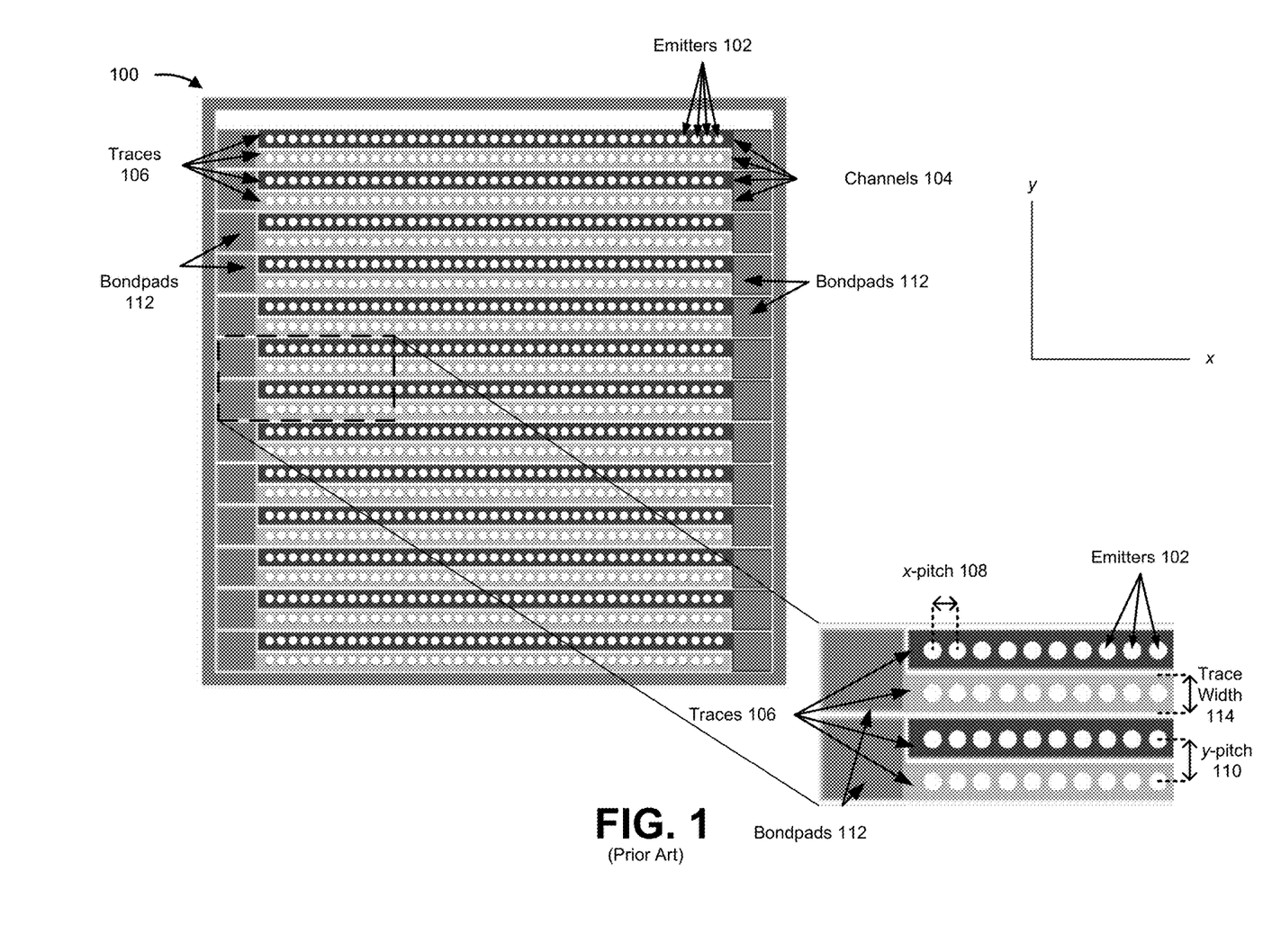
FIG. 1 is a diagram of a top view of an example layout of a conventional array of emitters described herein.

FIG. 1 is a diagram of a top view of an example layout of a conventional array 100 of emitters 102. The conventional array 100 corresponds to a conventional vertical-emitting device described herein. As shown in FIG. 1, the conventional array 100 includes multiple channels 104, where each channel 104 includes a row of emitters 102 (e.g., one or more emitters 102 arranged in a row). A gray-shaded area that is associated with each channel 104 represents a trace 106 (e.g., comprising a metallization layer) of the channel 104. As shown in the inset on the right side of FIG. 1, an emitter 102 may be separated from other emitters 102 by an x-pitch 108 and a y-pitch 110, where the x-pitch 108 is a distance between emitters 102 within a same row (e.g., a same channel 104) and the y-pitch 110 is a distance between emitters 102 in adjacent rows (e.g., adjacent channels 104).

Each channel 104 may be associated with a bondpad 112 that provides an input electric current that passes through a trace 106 of the channel 104 (e.g., to provide power to the emitters 102 that are included in the channel 104). For example, as shown in FIG. 1, bondpads 112 arranged on the left side of the conventional array 100 may respectively provide input electric current to the traces 106 associated with light gray shading and the bondpads 112 arranged on the right side of the conventional array 100 may provide respective input electric current to the traces 106 associated with dark gray shading.

As further shown in FIG. 1, a trace 106 of a channel 104 has a uniform trace width 114 (e.g., along the trace 106 in the x-direction). Due to trace impedance (e.g., resistance) associated with the uniform trace width 114, an input electric current that passes through the trace 106 is highest at a position on the trace 106 nearest a bondpad 112 that supplies the input electric current to the channel 104 and lowest at a position on the trace 106 that is farthest from the bondpad 112. Accordingly, in many cases, the bondpad 112 is not able to supply an equal amount of input electric current to the emitters 102 of the channel 104 (e.g., an emitter 102 of the channel 104 that is closer to the bondpad 112 will receive a greater amount of input electric current than another emitter 102 of the channel 104 that is farther from the bondpad 112).

As indicated above, FIG. 1 is provided as an example. Other examples may differ from what is described with regard to FIG. 1.

Figure 2A:
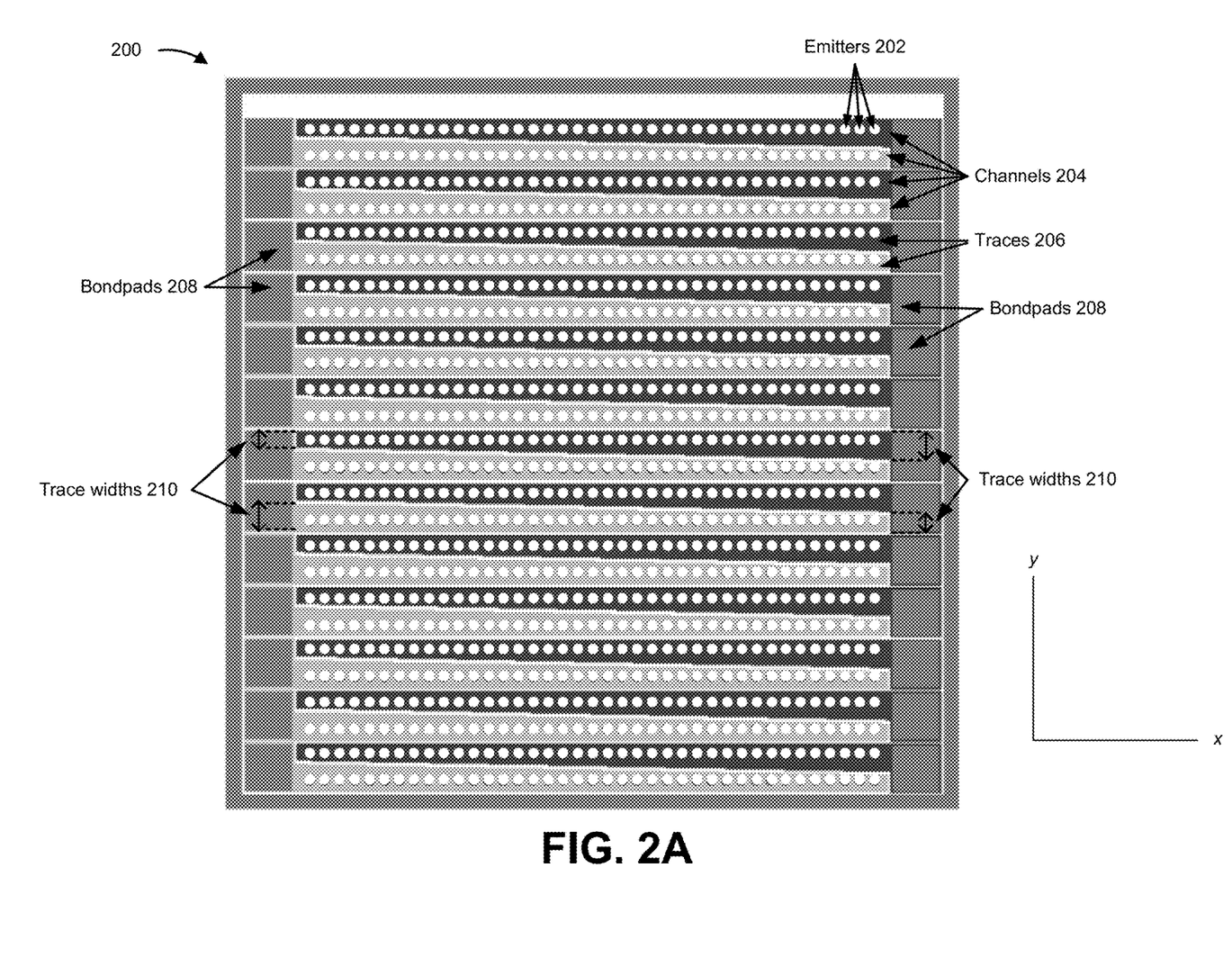
FIGS. 2A-2B are diagrams of a top view of an implementation of an example array of emitters described herein.
Figure 2B:
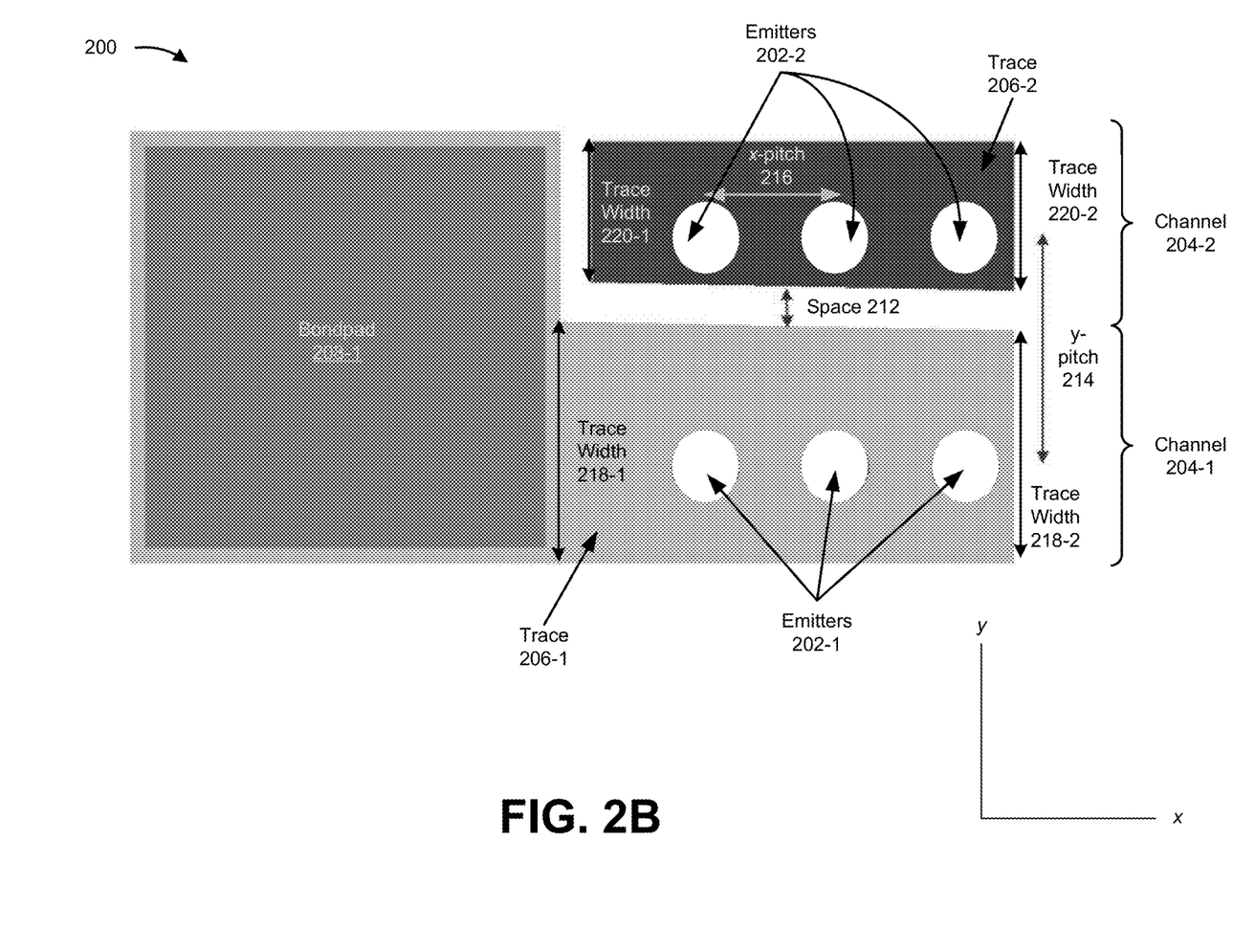

FIGS. 2A-2B are diagrams of a top view of an implementation of an example array 200 of emitters 202 described herein. The array 200 may correspond to a vertical-emitting device, such as a VCSEL array, described herein. As shown in FIG. 2A, the array 200 may include multiple channels 204, where each channel 204 includes a row of emitters 202 (e.g., two or more emitters 202 arranged in a row). The emitters 202 may be equally spaced within the row of emitters 202 (e.g., each emitter 202, of the row of emitters 202, may be separated from an adjacent emitter 202, of the row of emitters 202, by the same distance in the x-direction). A trace 206 (e.g., comprising at least one metallization layer) may be included in each channel 204 (shown in FIG. 2A as a gray-shaded area for each channel 204).

A channel 204 may be associated with a bondpad 208 that provides an input electric current to a trace 206 of the channel 204 (e.g., via an input end of the trace 206). The trace 206 may be configured to transmit the input electric current to a row of emitters 202 that are included in the channel 204 (e.g., to provide power to the emitters 202) from the input end of the trace 206. For example, as shown in FIG. 2A, bondpads 208 arranged on the left side of the array 200 may respectively provide input electric current to the traces 206 associated with light gray shading via input ends of the traces 206 on the left sides of the traces 206 and the bondpads 208 arranged on the right side of the array 200 may respectively provide input electric current to the traces 206 associated with dark gray shading via input ends of the traces 206 on the right sides of the traces 206.

As further shown in FIG. 2A, a trace 206 of a channel 204 may have a tapered trace width 210 along a length of the trace 206 (e.g., a trace width that is tapered along its x-direction). For example, the trace width 210 of the trace 206 may be at a maximum at a position on the trace 206 that is closest to an input end of the trace 206 (e.g., that contacts a bondpad 208 associated with the channel 204) and may progressively decrease at one or more positions on the trace 206 that are farther away from the input end, with the trace width 210 at a minimum at a position on the trace 206 that is farthest from the input end.

As further shown in FIG. 2A, a trace 206 may be associated with a trace configuration direction and/or a taper direction. For example, when a trace 206 of a channel 204 is associated with an input end of the trace 206 arranged on the left side of the array 200 (e.g., a trace 206 associated with light gray shading in FIG. 2A), the trace 206 may be associated with a left-to-right trace configuration direction (e.g., input electric current transmits left-to-right from the input end of the trace 206 through the trace 206) and/or a left-to-right taper direction (e.g., a left side of the trace 206 may have a greater trace width 210 than that of a right side of the trace 206). As another example, when a trace 206 of a channel 204 is associated with an input end of the trace 206 arranged on the right side of the array (e.g., a trace 206 associated with dark gray shading in FIG. 2A), the trace 206 may be associated with a right-to-left trace configuration direction (e.g., input electric current transmits right-to-left from input end of the trace 206 through the trace 206) and/or a right-to-left taper direction (e.g., a right side of the trace 206 may have a greater trace width 210 than that of a left side of the trace 206).

As further shown in FIG. 2A, the array 200 may have an alternating channel configuration, where a first channel 204 that includes a first trace 206 associated with a first trace configuration direction and/or first taper direction may be adjacent to a second channel 204 that includes a second trace 206 associated with a second trace configuration and/or second taper direction. For example, the array 200 may include a first channel 204 that includes a first trace 206 associated with a left-to-right trace configuration direction and/or a left-to-right taper direction adjacent to a second channel 204 that includes a second trace 206 associated with a right-to-left trace configuration direction and/or a right-to-left taper direction. As shown in FIG. 2A, the alternating channel configuration may repeat one or more times.

FIG. 2B shows a magnified portion of the example array 200. As shown in FIG. 2B, a channel 204-1 of the array 200 may include a plurality of emitters 202-1 and a trace 206-1 and a channel 204-2 of the array 200 may include a plurality of emitters 202-2 and a trace 206-2. A bondpad 208-1 may be associated with the channel 204-1 and may be configured to transmit input electric current to the plurality of emitters 202-1 via the trace 206-1 (e.g., via an input end of the trace 206-1 that contacts the bondpad 208-1). Because the input end of the trace 206-1 is arranged on the left side of the array 200, as shown in FIG. 2B, trace 206-1 may be associated with a left-to-right trace configuration direction. Additionally, or alternatively, a bondpad 208-2 (not shown in FIG. 2B) may be associated with the channel 204-2 and may be configured to transmit input electric current to the plurality of emitters 202-2 via the trace 206-2 (e.g., via an input end of the trace 206-2 that contacts the bondpad 208-1). The input end of the trace 206-2 (not shown in FIG. 2B) may be arranged on a right side of the array 200 and, accordingly, trace 206-2 may be associated with a right-to-left trace configuration direction.

As further shown in FIG. 2B, the channel 204-1 may be adjacent to the channel 204-2 such that a space 212 separates the channel 204-1 and the channel 204-2. In some implementations, ay-pitch 214 between the channel 204-1 and the channel 204-2 may exist (e.g., a same distance, within a tolerance, may separate one or more corresponding positions of respective centerlines of the channel 204-1 and the channel 204-2). Additionally, or alternatively, an x-pitch 216 between adjacent emitters 202-1 of the plurality of emitters 202-1 and/or between adjacent emitters 202-2 of the plurality of emitters 202-2 may exist (e.g., a same distance, within a tolerance, may separate adjacent emitters 202-1 of the plurality of emitters 202-1 within a channel 204-1 and/or adjacent emitters 202-2 of the plurality of emitters 202-2 with a channel 204-2).

As further shown in FIG. 2B, a trace width 218-1 of the trace 206-1 at a position on the trace 206-1 that is nearest the input end of the trace 206-1 is greater than a trace width 220-1 of the trace 206-2 at a position on the trace 206-2 that is farthest from input end of the trace 206-2 (not shown in FIG. 2B). For example, trace width 218-1 may be approximately 48 microns and trace width 220-1 may be approximately 28 microns (e.g., indicating that a trace 206-1 may taper from a trace width 218-1 of 48 microns at a position on the trace 206-1 nearest an input end of the trace 206-1 to a trace width 218-2 of 28 microns at a position on the trace 206-1 farthest from the input end of the trace 206-1).

As further shown in FIG. 2B, a trace width 218-2 of the trace 206-1 at another position on the trace 206-1 (e.g., that is farther from the input end of the trace 206-1 than the position associated with the trace width 218-1) is less than the trace width 218-1. Accordingly, the trace 206-1 may have a left-to-right taper direction, with a left side of the trace 206-1 having a greater trace width 218 than that of a right side of the trace 206-1. Additionally, as further shown in FIG. 2B, a trace width 220-2 of the trace 206-2 at another position on the trace 206-2 (e.g., that is closer to the input end of the trace 206-2 than the position associated with the trace width 220-1) is greater than the trace width 220-1. Accordingly, the trace 206-2 may have a right-to-left taper direction (e.g., may have a different or an opposite taper to that of the trace 206-1), with a right side of the trace 206-2 having a greater trace width 220 than that of a left side of the trace 206-2.

As indicated above, FIGS. 2A-2B are provided as an example. Other examples may differ from what is described with regard to FIGS. 2A-2B.

Figure 3:
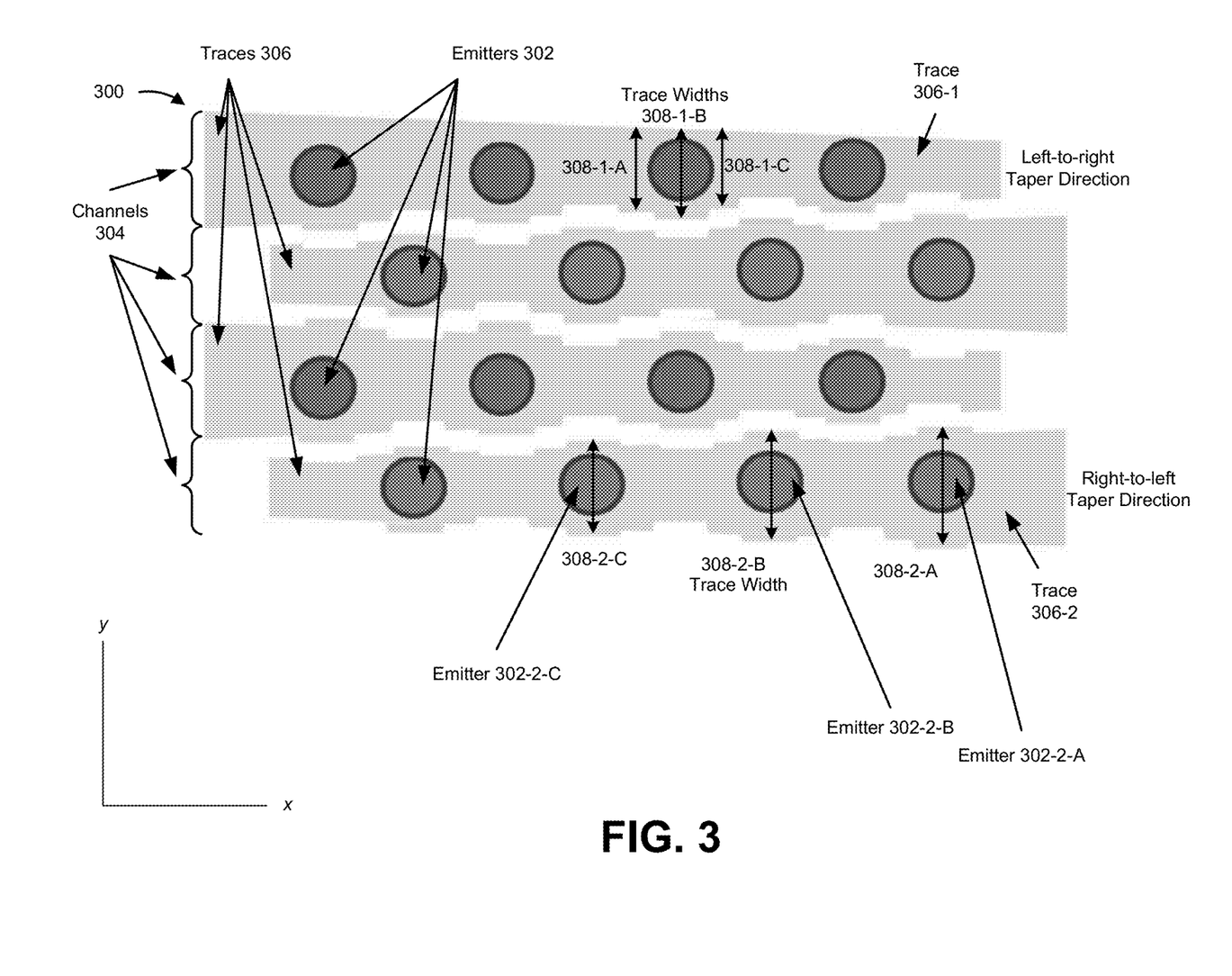
FIG. 3 is a diagram of a top view of an implementation of an example array of emitters described herein.

FIG. 3 is a diagram of a top view of an implementation of an example array 300 of emitters 302 described herein. The array 300 may correspond to a vertical-emitting device, such as a VCSEL array, described herein. As shown in FIG. 3, the array 300 may include multiple channels 304, where each channel 304 includes a row of emitters 302 (e.g., two or more emitters 302 arranged in a row). A trace 306 (e.g., comprising at least one metallization layer) may be included in each channel 304 (shown in FIG. 2A as a gray-shaded area for each channel 304). In some implementations, as shown in FIG. 3, adjacent channels 304 may include respective rows of emitters 302 that are laterally offset from each other (e.g., in an x-direction).

As further shown in FIG. 3, a trace 306 of a channel 304 may be tapered (e.g., with a left-to-right taper direction or a right-to-left taper direction) with a non-uniform taper along the trace 306 (e.g., localized variation in a trace width 308 of the trace 306 may occur along the trace 306). For example, the trace width 308 may increase at a position on the trace 306 near an emitter 302 (e.g., a position associated with a center of the emitter 302) of the trace 306 to satisfy fabrication tolerance requirements, to accommodate emission of light from the emitter 302, and/or the like. In one example, as shown in FIG. 3, a trace 306-1 may have a trace width 308-1-A at a first position on the trace 306-1 that is less than a trace width 308-1-B at a second position (e.g., that is associated with a center of an emitter 302) on the trace 306-1, but is greater than a trace width 308-1-C at a third position on the trace 306-1. As shown in FIG. 3, the first position is to the left of the second position, and the second position is to the left of the third position. Therefore, trace 306-1 is associated with a left-to-right taper direction, even though a taper of the trace 306-1 is not smooth and/or uniform (e.g., even though the trace width 308-1-B is greater than both trace width 308-1-A and trace width 308-1-C).

In some implementations, a trace 306 may be tapered with respect to one or more representative positions on the trace 306. For example, as shown in FIG. 3, a trace 306-2 may have a trace width 308-2-A at a first position associated with a first emitter 302-2-A of the trace 306-2 (e.g., a position associated with a center of the first emitter 302-2-A) on the trace 306-2 that is greater than a trace width 308-2-B at a second position associated with a second emitter 302-2-B of the trace 306-2 (e.g., a position associated with a center of the second emitter 302-2-B) on the trace 306-2, which is greater than a trace width 308-2-C at a third position associated with a third emitter 302-2-C of the trace 306-2 (e.g., a position associated with a center of the third emitter 302-2-C) on the trace 306-2, and so on. As shown in FIG. 3, the first position is to the right of the second position, and the second position is to the right of the third position. Therefore, the trace 306-2 has a right-to-left taper direction, even though the taper of the trace 306-2 is not smooth and/or uniform.

While FIG. 3 shows discrete variations in a trace width 308 of a trace 306 along a length of the trace 306, some implementations described herein contemplate variations of trace widths that are more or less smooth and/or uniform (e.g., variations in the trace width 308 that may appear more "smooth" or more "rough" along the length of the trace 306).

As indicated above, FIG. 3 is provided as an example. Other examples may differ from what is described with regard to FIG. 3.

Figure 4:
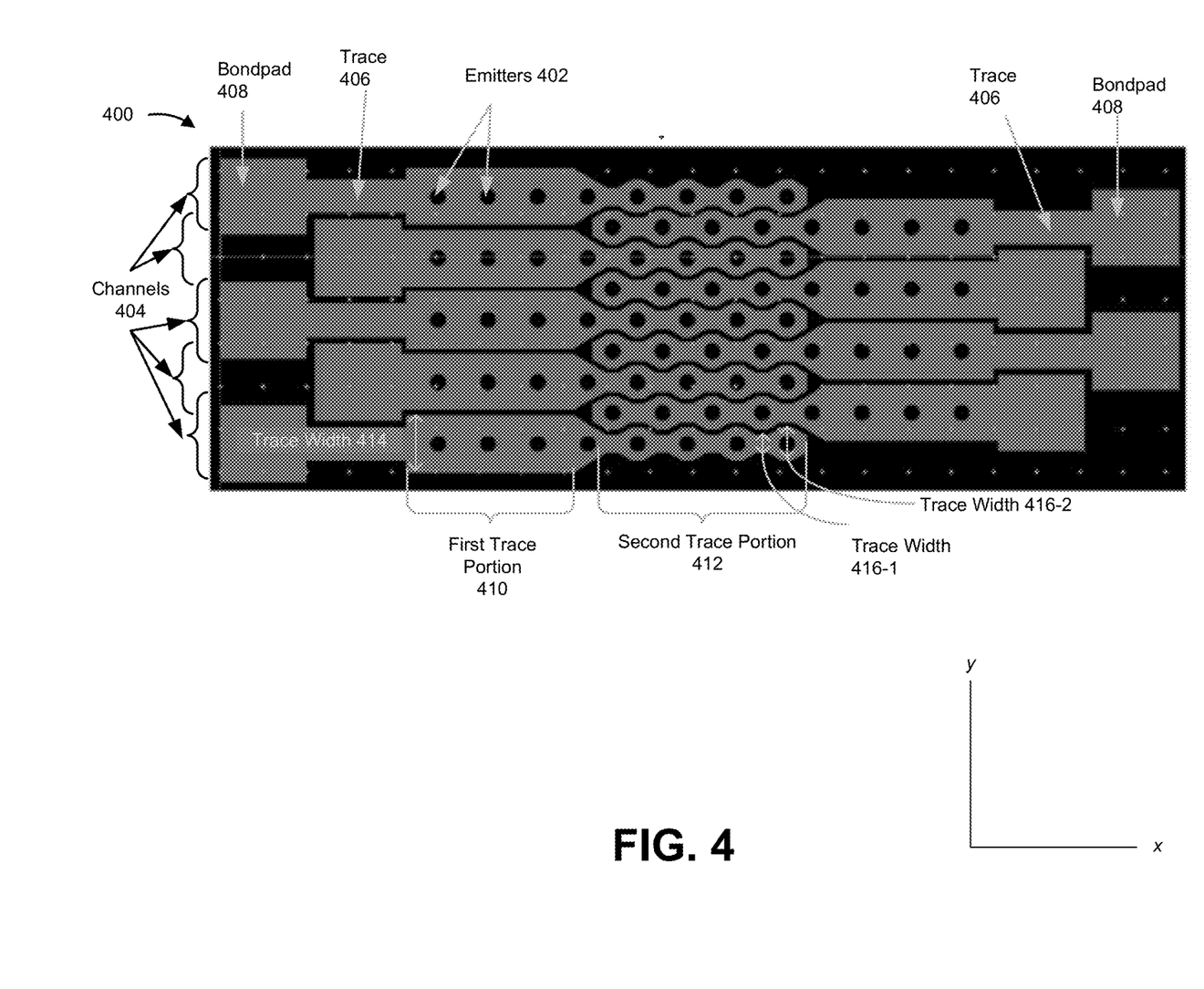
FIG. 4 is a diagram of a top view of an implementation of an example array of emitters described herein.

FIG. 4 is a diagram of a top view of an implementation of an example array 400 of emitters 402 described herein. The array 400 may correspond to a vertical-emitting device, such as a VCSEL array, described herein. As shown in FIG. 4, the array 400 may include multiple channels 404, where each channel 404 includes a row of emitters 402 (e.g., two or more emitters 402 arranged in a row). The emitters 402 may be equally spaced within the row of emitters 402 (e.g., each emitter 402, of the row of emitters 402, may be separated from an adjacent emitter 402, of the row of emitters 402, by the same distance in the x-direction). A trace 406 (e.g., comprising at least one metallization layer) may be included in each channel 404 (shown in FIG. 4 as a gray-shaded area for each channel 404).

A channel 404 may be associated with a bondpad 408 that provides an input electric current to a trace 406 of the channel 404 (e.g., via an input end of the trace 406). The trace 406 may be configured to transmit the input electric current to a row of emitters 402 that are included in the channel 404 (e.g., to provide power to the emitters 402) from the input end of the trace 406. For example, as shown in FIG. 4, bondpads 408 arranged on the left side of the array 400 may respectively provide input electric current to a first set of traces 406 (e.g., traces 406 with input ends respectively attached to the bondpads 408 arranged on the left side of the array 400) and the bondpads 408 arranged on the right side of the array 400 may respectively provide input electric current to a second set of traces 406 (e.g., traces 406 with input ends respectively attached to the bondpads 408 arranged on the right side of the array 400).

As further shown in FIG. 4, a trace 406 of a channel 404 may have a first trace portion 410 that is closest to an input end of the trace 406 (e.g., that is connected to a bondpad 408 associated with the channel 404) and a second trace portion 412 that is farthest from the input end of the trace 406. The first trace portion 410 may be associated with a first set of emitters 402, of a row of emitters 402 included in the channel 404. For example, the first trace portion 410 may be configured to transmit input electric current (e.g., provided by the bondpad 408) from the input end of the trace 406 to the first set of emitters 402. The second trace portion 412 may be associated with a second set of emitters 402, of the row of emitters 402 included in the channel 404. For example, the second trace portion 412 may be configured to transmit the input electric current to the second set of emitters 402.

As further shown in FIG. 4, the first trace portion 410 may have a uniform trace width 414 along a length of the first trace portion 410 (e.g., a trace width that is constant, within a tolerance, along the length of the first trace portion 410). The second trace portion 412 may have a variable trace width 416 along a length of the second trace portion 412 (e.g., a trace width that changes along the length of the second trace portion 412). For example, as shown in FIG. 4, the second trace portion 412 may have a minimum trace width 416-1 at a position associated with a midpoint of adjacent emitters 402 of the second set of emitters 402. As another example, the second trace portion 412 may have a maximum trace width 416-2 at a position associated with a center of an emitter 402 of the second set of emitters 402. As shown in FIG. 4, the maximum trace width 416-2 may be less than the uniform trace width 414 of the first trace portion 410. In some implementations, the variable trace width 416 may vary multiple times between the minimum trace width 416-1 (e.g., at positions associated with midpoints of adjacent emitters 402 of the second set of emitters 402) and the maximum trace width 416-2 (e.g., at positions associated with respective centers of the second set of emitters 402) along the length of the second trace portion 412. Additionally, or alternatively, the variable trace width 416 be may tapered along the length of the second trace portion (e.g., in a similar manner as that described above in relations to FIGS. 2A-2B and 3), such that that minimum trace width 416-1 between emitters 402 becomes increasingly smaller as the second trace portion 412 extends away from its respective first trace portion 410 and the input end of the trace 406.

As further shown in FIG. 4, a trace 406 may be associated with a trace configuration direction. For example, when a trace 406 of a channel 404 is associated with an input end of the trace 406 arranged on the left side of the array 400, the trace 406 may be associated with a left-to-right trace configuration direction (e.g., input electric current transmits left-to-right from the input end of the trace 406 through the trace 406). As another example, when a trace 406 of a channel 404 is associated with an input end of the trace 406 arranged on the right side of the, the trace 406 may be associated with a right-to-left trace configuration direction (e.g., input electric current transmits right-to-left from the input end of the trace 406 through the trace 406).

As further shown in FIG. 4, the array 400 may have an alternating channel configuration, where a first channel 404 that includes a first trace 406 associated with a first trace configuration direction may be adjacent to a second channel 404 that includes a second trace 406 associated with a second trace configuration. For example, the array 400 may include a first channel 404 that includes a first trace 406 associated with a left-to-right trace configuration direction adjacent to a second channel 404 that includes a second trace 406 associated with a right-to-left trace configuration direction. As shown in FIG. 4, the alternating channel configuration may repeat one or more times.

As further shown in FIG. 4, the array 400 may include multiple channels 404, where each channel 204 includes a row of emitters 402 and a trace 406 that comprises a first trace portion 410 and a second trace portion 412. In some implementations, the second trace portions 412 of the traces 406 of the channels 404 may align with each other (e.g., along the x-axis, as shown in FIG. 4). In some implementations, as shown in FIG. 4, a subset of emitters 402 associated with a second trace portion 412 of a trace 406 may be laterally offset from a subset of emitters 402 associated with a second trace portion 412 of an adjacent trace 406 (e.g., such that emitters 402 of adjacent channels 404 do not align on the x-axis).

As indicated above, FIG. 4 is provided as an example. Other examples may differ from what is described with regard to FIG. 4.

Figure 5:
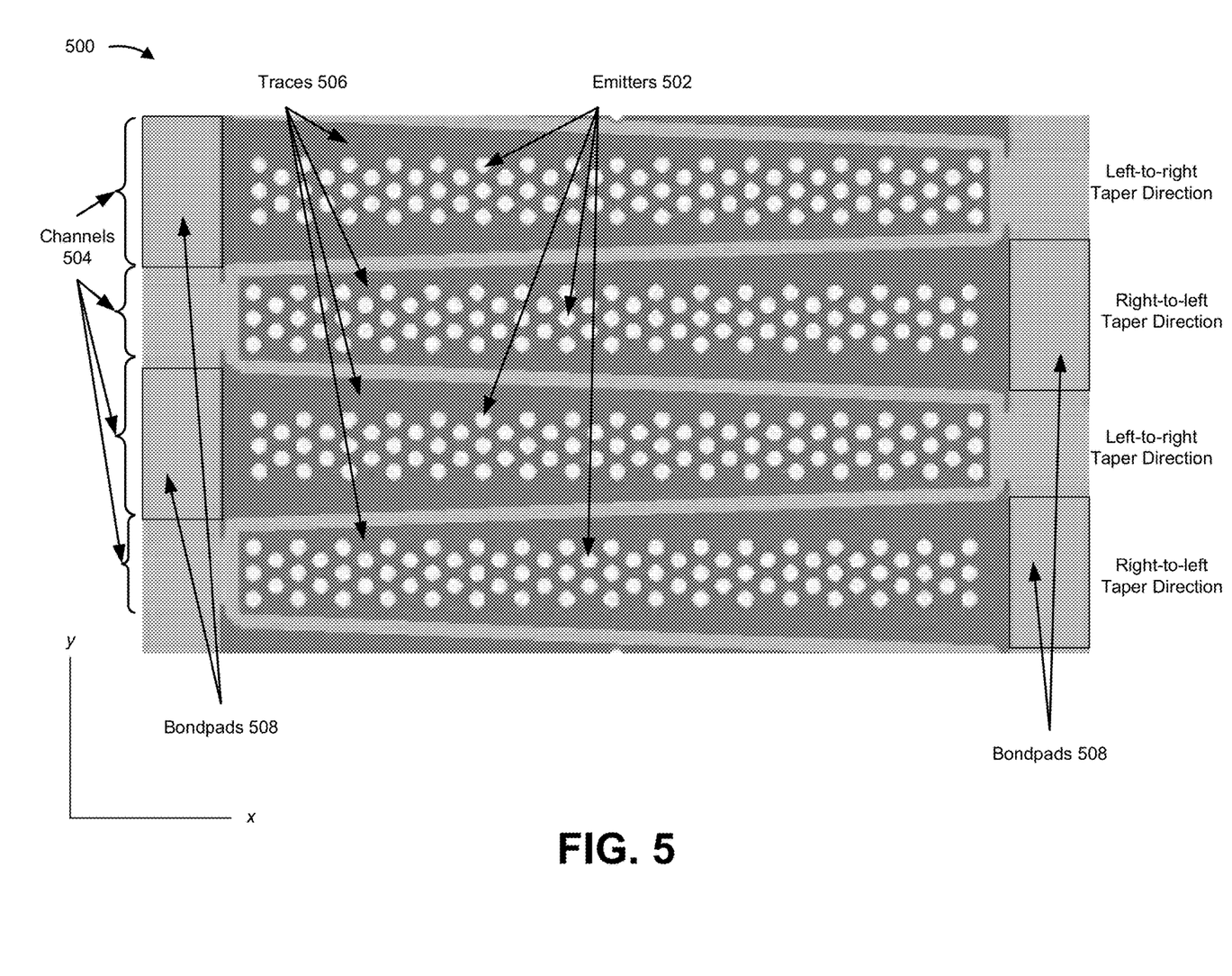
FIG. 5 is a diagram of a top view of an implementation of an example array of emitters described herein.

FIG. 5 is a diagram of a top view of an implementation of an example array 500 of emitters 502 described herein. The array 500 may correspond to a vertical-emitting device, such as a VCSEL array, described herein. As shown in FIG. 5, the array 500 may include multiple channels 504, where each channel 504 includes multiple rows of emitters 502 (e.g., where each row includes two or more emitters 502). The emitters 502 may be equally spaced within a row of emitters 502 (e.g., each emitter 502, of the row of emitters 502, may be separated from an adjacent emitter 502, of the row of emitters 502, by the same distance in the x-direction). In some implementations, as shown in FIG. 5, adjacent rows of emitters 502 within a channel 504 may be laterally offset from each other (e.g., in an x-direction). In some implementations, instead of multiple rows of emitters 502, a channel may include a zone of emitters 502, where emitters 502 are arranged in a nonlinear (e.g., a random and/or a pseudorandom) arrangement in the zone.

A trace 506 (e.g., comprising at least one metallization layer) may be included in each channel 504. A channel 504 may be associated with a bondpad 508 that provides an input electric current to a trace 506 of the channel 504 (e.g., via an input end of the trace 506). The trace 506 may be configured to transmit the input electric current to the multiple rows of emitters 502 that are included in the channel 504 (e.g., to provide power to the emitters 502) from the input end of the trace 506. For example, as shown in FIG. 5, bondpads 508 arranged on the left side of the array 500 may respectively provide input electric current to associated traces 506 via input ends of the traces 506 on the left sides of the traces 506 and the bondpads 508 arranged on the right side of the array 500 may respectively provide input electric current to associated traces 506 via input ends of the traces 506 on the right sides of the traces 506.

As further shown in FIG. 5, a trace 506 of a channel 504 may have a tapered trace width 510 along a length of the trace 506 (e.g., a trace width that is tapered along its x-direction). For example, the trace width 510 of the trace 506 may be at a maximum at a position on the trace 506 that is closest to an input end of the trace 506 (e.g., that contacts a bondpad 508 associated with the channel 504) and may progressively decrease at one or more positions on the trace 506 that are farther away from the input end, with the trace width 510 at a minimum at a position on the trace 506 that is farthest from the input end.

As further shown in FIG. 5, a trace 506 may be associated with a trace configuration direction and/or a taper direction. For example, when a trace 506 of a channel 504 is associated with an input end of the trace 506 arranged on the left side of the array 500, the trace 506 may be associated with a left-to-right trace configuration direction (e.g., input electric current transmits left-to-right from the input end of the trace 506 through the trace 506) and/or a left-to-right taper direction (e.g., a left side of the trace 506 may have a greater trace width 510 than that of a right side of the trace 506). As another example, when a trace 506 of a channel 504 is associated with an input end of the trace 506 arranged on the right side of the array, the trace 506 may be associated with a right-to-left trace configuration direction (e.g., input electric current transmits right-to-left from input end of the trace 506 through the trace 506) and/or a right-to-left taper direction (e.g., a right side of the trace 506 may have a greater trace width 510 than that of a left side of the trace 506).

As further shown in FIG. 5, the array 500 may have an alternating channel configuration, where a first channel 504 that includes a first trace 506 associated with a first trace configuration direction and/or first taper direction may be adjacent to a second channel 504 that includes a second trace 506 associated with a second trace configuration and/or second taper direction. For example, the array 500 may include a first channel 504 that includes a first trace 506 associated with a left-to-right trace configuration direction and/or a left-to-right taper direction adjacent to a second channel 504 that includes a second trace 506 associated with a right-to-left trace configuration direction and/or a right-to-left taper direction. As shown in FIG. 5, the alternating channel configuration may repeat one or more times.

As indicated above, FIG. 5 is provided as an example. Other examples may differ from what is described with regard to FIG. 5.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," "right," "left," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical-cavity surface-emitting laser (VCSEL) array, comprising:
    a plurality of channels;
    a plurality of traces; and
    a plurality of emitters, wherein:
        a channel, of the plurality of channels, includes a set of emitters, of the plurality of emitters, arranged in a row of emitters, the channel includes a trace, of the plurality of traces, that has a first trace portion that is closest to an input end of the trace and a second trace portion that is farthest from the input end,
wherein the first trace portion includes a first subset of emitters, of the set of emitters, that are laterally aligned with other emitters of a portion of an adjacent trace, and
wherein the second trace portion includes a second subset of emitters, of the set of emitters, that are laterally offset from other emitters of another portion of another adjacent trace.

2. The VCSEL array of claim 1, wherein the trace is configured to transmit an input electric current to the set of emitters included in the channel from an input end of the trace,
wherein the trace has a trace width that has a maximum width at a position on the trace that is closest to the input end.

3. The VCSEL array of claim 1, wherein each emitter, of the set of emitters that are within the row of emitters, is separated from an adjacent emitter by the same distance.

4. The VCSEL array of claim 1, wherein the trace is associated with a first taper direction,
wherein the channel is adjacent to an additional channel, of the plurality of channels, that includes the adjacent trace, wherein:
the adjacent trace has a trace width that is tapered along a length of the adjacent trace, and
the adjacent trace is associated with the first taper direction.

5. The VCSEL array of claim 1, wherein the channel is adjacent to an additional channel, of the plurality of channels, that includes the adjacent trace, and
wherein one or more positions of a centerline associated with the channel and one or more corresponding positions of a centerline associated with the additional channel are separated by a same distance.

6. The VCSEL array of claim 1, wherein the first trace portion is adjacent to each of a first pair of traces, and the second trace portion is adjacent to each of a second pair of traces.

7. The VCSEL array of claim 1, wherein the channel includes a bondpad that is laterally offset from another bondpad of the adjacent trace.

8. A vertical-cavity surface-emitting laser (VCSEL) array, comprising:
a plurality of channels;
a plurality of traces; and
a plurality of emitters; wherein:
a channel, of the plurality of channels, includes a set of emitters, of the plurality of emitters, arranged in a row of emitters, and
the channel includes a trace, of the plurality of traces, that has a first trace portion that is closest to an input end of the trace and a second trace portion that is farthest from the input end,
wherein the first trace portion includes a first subset of emitters, of the set of emitters, and is adjacent to each of a first pair of traces, and
wherein the second trace portion includes a second subset of emitters, of the set of emitters, and is adjacent to each of a second pair of traces.

9. The VCSEL array of claim 8, wherein the second trace portion has a variable trace width.

10. The VCSEL array of claim 9, wherein the variable trace width has a maximum width at a position along the second trace portion that is associated with an emitter, of the set of emitters, that is associated with the second trace portion, and
wherein the variable trace width has a minimum width at a position along the second trace portion that is associated with a midpoint of adjacent emitters, of the set of emitters, that are associated with the second trace portion.

11. The VCSEL array of claim 8, wherein each emitter, of the set of emitters that are within the row of emitters, is separated from an adjacent emitter, of the set of emitters, by a same distance.

12. The VCSEL array of claim 8, wherein the trace is associated with a first trace configuration direction, wherein:
an additional trace, of the first pair of traces, is configured to transmit an input electric current to an additional set of emitters that is associated with an additional channel;
the additional trace has an additional first trace portion that includes an additional first subset of emitters and an additional second trace portion that includes an additional second subset of emitters; and
the additional trace is associated with the first trace configuration direction.

13. A vertical-cavity surface-emitting laser (VCSEL) array, comprising:
a plurality of channels;
a plurality of traces; and
a plurality of emitters; wherein:
a channel, of the plurality of channels, includes a set of emitters, of the plurality of emitters, arranged in a row of emitters; and
the channel includes a trace, of the plurality of traces, that is configured to transmit an input electric current to the set of emitters from an input end of the trace, associated with the channel,
wherein the trace comprises a first trace portion that is closest to the input end and a second trace portion that is farthest from the input end,
wherein the first trace portion includes a first subset of emitters, of the set of emitters, and has a uniform first trace width, and
wherein the second trace portion includes a second subset of emitters, of the set of emitters, and has a variable second trace width.

14. The VCSEL array of claim 13, wherein the variable second trace width is tapered along a length of the second trace portion.

15. The VCSEL array of claim 13, wherein a maximum width of the variable second trace width is less than the uniform first trace width.

16. The VCSEL array of claim 13, wherein the variable second trace width has a maximum width at positions along a length of the second trace portion that are associated with a center of each emitter of the second subset of emitters, and
wherein the variable second trace width has a minimum width at positions along the length of the second trace portion that are associated with midpoints of adjacent emitters of the second subset of emitters.

17. The VCSEL array of claim 13, wherein the channel is adjacent to an additional channel, of the plurality of channels, that includes an additional set of emitters, of the plurality of emitters, arranged in an additional row of emitters, wherein:
the additional channel includes an additional trace, of the plurality of traces, and the additional trace comprises a first additional trace portion that is closest to an additional input end associated with the additional channel and a second additional trace portion that is farthest from the additional input end, wherein the first additional trace portion includes a first additional subset of emitters, of the additional set of emitters, and is associated with a uniform first additional trace width, and wherein the second additional trace portion includes a second additional subset of emitters, of the additional set of emitters, and is associated with a variable second additional trace width.

18. The VCSEL array of claim 17, wherein the trace is associated with a first trace configuration direction and the additional trace is associated with a second trace configuration direction.

19. The VCSEL array of claim 17, wherein the second trace portion of the trace of the channel is aligned with the second additional trace portion of the additional trace of the additional channel.

20. The VCSEL array of claim 17, wherein the second additional subset of emitters of the additional trace of the additional channel is laterally offset from the second subset of emitters of the trace of the channel.

* * * * *